United States Patent [19]

Kangas et al.

[11] Patent Number: 5,563,023
[45] Date of Patent: Oct. 8, 1996

[54] PHOTOIMAGEABLE ELEMENTS

[75] Inventors: Steven L. Kangas, Woodbury; Emil D. Sprute, Apple Valley; Dean J. Stych, New Brighton, all of Minn.

[73] Assignee: Minnesota Mining and Manufacturing Co., St. Paul, Minn.

[21] Appl. No.: 333,489

[22] Filed: Nov. 2, 1994

[51] Int. Cl.$^6$ .......................... G03C 1/492; G03C 1/494; G03C 1/76

[52] U.S. Cl. ................... 430/273.1; 430/270.1; 430/271.1; 430/961; 430/143; 430/293; 430/302; 430/165; 430/166

[58] Field of Search ............................. 430/270.1, 271.1, 430/273.1, 259, 961, 143, 293, 302, 165, 166

[56]  References Cited

U.S. PATENT DOCUMENTS

| | | | |
|---|---|---|---|
| Re. 24,906 | 12/1960 | Ulrich | 206/59 |
| 2,714,066 | 7/1955 | Jewett et al. | 95/8 |
| 2,861,058 | 11/1958 | Unruh et al. | 260/78.5 |
| 3,671,236 | 6/1972 | Beusekom | 96/15 |
| 4,221,862 | 9/1980 | Naito et al. | 430/536 |
| 4,268,601 | 5/1981 | Namiki et al. | 430/159 |
| 4,304,923 | 12/1981 | Rousseau | 560/26 |
| 4,588,669 | 5/1986 | Asano | 430/156 |
| 4,596,757 | 6/1986 | Barton et al. | 430/257 |
| 4,719,169 | 1/1988 | Platzer et al. | 430/258 |
| 4,741,985 | 5/1988 | Aoai et al. | 430/175 |
| 4,774,161 | 9/1988 | Sekiya et al. | 430/175 |
| 4,777,112 | 10/1988 | LaPointe et al. | 430/213 |
| 4,885,225 | 12/1989 | Heller et al. | 430/160 |
| 4,902,594 | 2/1990 | Platzer | 430/14 |
| 4,937,168 | 6/1990 | Platzer | 430/143 |
| 4,948,693 | 8/1990 | Shadrach et al. | 430/143 |
| 4,952,482 | 8/1990 | Barton et al. | 430/325 |
| 4,957,845 | 9/1990 | Isono et al. | 430/156 |
| 4,963,462 | 10/1990 | Wilczak | 430/143 |
| 4,999,266 | 3/1991 | Platzer et al. | 430/14 |
| 5,008,174 | 4/1991 | Platzer | 430/143 |
| 5,017,462 | 5/1991 | Stahlhofen | 430/325 |
| 5,053,311 | 10/1991 | Makino et al. | 430/166 |
| 5,053,381 | 10/1991 | Chapman et al. | 503/227 |
| 5,070,001 | 12/1991 | Stahlhofen | 430/281 |
| 5,071,731 | 12/1991 | Chen et al. | 430/271 |
| 5,087,549 | 2/1992 | Peiffer | 430/253 |
| 5,093,221 | 3/1992 | Chen et al. | 430/257 |
| 5,100,757 | 3/1992 | Platzer et al. | 430/143 |
| 5,238,736 | 8/1993 | Tseng et al. | 428/327 |
| 5,248,583 | 9/1993 | Lundquist et al. | 430/263 |
| 5,258,261 | 11/1993 | Heller | 430/273 |
| 5,270,378 | 12/1993 | Johnson et al. | 524/520 |
| 5,298,361 | 3/1994 | Bonham | 430/260 |

FOREIGN PATENT DOCUMENTS

| | | |
|---|---|---|
| 0326249A2 | 8/1989 | European Pat. Off. . |
| 0509514A1 | 10/1992 | European Pat. Off. . |
| 0519591A1 | 12/1992 | European Pat. Off. . |
| 3834960A1 | 5/1989 | Germany . |

OTHER PUBLICATIONS

Recommended Inks for Melinex® Pretreated Films, Imperial Chemical Industries PLC, 1989.
S. Shen et al., "Dispersion Polymerization of Methyl Methacrylate: Mechanism of Particle Formation", *J. of Polymer Science: Part A: Polymer Chemistry*, 32, 1087–1100 (1994).
*Polymer Handbook*, Third Edition, Ed. J. Brandrup and E. H. Immergut, John Wiley & Sons, Inc., VI/435–441 (1989).
*AIRVOL® Polyvinyl Alcohol*, catalog, Air Products and Chemicals, Inc., Allentown, PA.
*Metals Handbook® Ninth Edition*, vol. 5, Surface Cleaning, Finishing, and Coating, 585–600.
Melinex® Polyester Films Product Information sheet, ICI Films.
Melinex® Polyester Film Product Information sheets, ICI Americas, Inc., 1985.
Melinex® Polyester Film Technical Data Melinex for Graphics, 1985.
Melinex® Technical Data sheets, ICI Americas Inc., Films Division.
Melinex® Polyester Film, Technical Data sheet, ICI Americas Inc., 1985.
Melinex® Product Information Technical Data sheet, ICI Americas Inc., Films Division, 1990.

*Primary Examiner*—Geraldine Letscher
*Attorney, Agent, or Firm*—Gary L. Griswold; Walter N. Kirn; James J. Trussell

[57]  ABSTRACT

A photoimageable element comprising: a substrate; a layer of a photosensitive composition comprising a photosensitive material coated on the substrate; and a protective overcoating comprising an oxygen barrier polymeric material and antiblocking particulate material wherein the oxygen barrier component has an oxygen permeability of no greater than about $10^{-14}$ cc(cm)/cm$^2$(sec)(Pa).

20 Claims, No Drawings

PHOTOIMAGEABLE ELEMENTS

FIELD OF THE INVENTION

The present invention relates to photoimageable elements, particularly to protective coatings for photosensitive imaging layers on the photoimageable elements.

BACKGROUND OF THE INVENTION

Photoimageable elements, such as lithographic printing plates, circuit boards, photolabels, photoresists, overlay color proofing films, and the like, typically consist of a substrate on which is coated a layer of a photosensitive material. Depending on the application, this photosensitive material can be coated on metal or plastic, for example. This photosensitive material, which can be a photopolymer, oligomer, monomer, or mixture thereof, typically either undergoes a reaction or promotes a reaction upon exposure to radiation thereby forming an image. In negative-acting systems, the nonexposed portions of the layer of photosensitive material are removed to produce an image. In positive-acting systems, the exposed portions of the layer of photosensitive material are removed to produce an image.

Negative-acting photosensitive imaging systems, e.g., photopolymerizable or radiation-polymerizable systems, typically include a layer of a composition containing a photosensitive material such as an unsaturated monomer or oligomer, a photoinitiator that is activated by radiation, binder resins, and optional colorants and other additives. In the production of free-radical initiated photopolymerizable coatings, the photoimaging reactions are subject to quenching by triplet oxygen thereby adversely affecting the imaging process. To prevent such triplet oxygen quenching of radiation formed free-radicals, the photosensitive layer can be overcoated with a polymer that has a low oxygen permeability. Such polymers are typically transparent, film-forming polymers that do not disrupt the photosensitive layer. In the past, suitable overcoat polymers were those that were soluble only in organic solvents. This created significant environmental concerns with respect to air quality and disposal, for example. More recently, water soluble overcoat polymers have been used to avoid many of the environmental concerns. One particularly suitable water soluble polymer is polyvinyl alcohol.

Polyvinyl alcohol is currently one of the most commonly used overcoat polymers in negative-acting, free-radical initiated, photosensitive imaging systems because of its low oxygen permeability. However, most polyvinyl alcohols are water soluble and therefore moisture sensitive. They also typically produce very smooth surfaces. Thus, they can be subject to blocking, particularly when they come into contact with a second smooth surface under conditions of high humidity. Furthermore, polyvinyl alcohol overcoat layers are often soft and easily embossed or scratched during the photoimaging process, as well as during storage, handling, and transport. One method by which at least some of these problems have been overcome is through the use of organic polymeric beads such as polymethylmethacrylate beads. See U.S. Pat. No. 5,258,261 (Heller), which utilizes polymeric substrates.

SUMMARY OF THE INVENTION

The invention provides a photoimageable element comprising a substrate, a layer of a photosensitive composition comprising a photosensitive material coated on the substrate, and a protective overcoating comprising an oxygen barrier polymeric material and an antiblocking particulate material; wherein the oxygen barrier polymeric material has an oxygen permeability of no greater than about $10^{-14}$ cc(cm)/cm$^2$(sec)(Pa). The oxygen barrier polymeric material preferably comprises polyvinyl alcohol. The antiblocking particulate material is preferably polymethylmethacrylate beads. The photoimageable element can further include a pressure sensitive adhesive layer and a release liner covering the pressure sensitive adhesive on the side, i.e., a second side, of the substrate opposite that of the photosensitive layer, which is coated on a first side of the substrate. Preferred photoimageable elements are photolabels, e.g., metal labels.

DETAILED DESCRIPTION OF THE INVENTION

The present invention is directed to photoimageable elements that include a substrate on which is coated a photosensitive composition for imaging and a protective overcoating. The protective overcoating is coated over the photosensitive composition and protects the photosensitive composition from the detrimental effects of oxygen. It includes an oxygen barrier polymeric material and an antiblocking particulate material.

In the practice of the invention, the substrate can be made from metals, e.g., aluminum, stainless steel, and the like. Preferably, the substrate is a metal foil or sheeting such as aluminum sheeting, preferably having a thickness of about 2–20 mils (0.05–0.5 mm), and more preferably about 4–15 mils (0.1–0.38 mm).

The substrate can be optionally treated to enhance adhesion of the photosensitive material to the substrate, if desired. Metal substrates are usually treated for protection of the metal surface and/or for enhancing the adhesion of coatings to the metal. Multiple treatments can be used to provide variations in surface color, adhesion to specific coatings, etc. Typical processes include, for example, degreasing, desmutting, anodizing, dyeing, sealing of the surface, and silicate coating. As with polymeric substrates, many metal substrates can be purchased pretreated. Preferably, the metal substrate is cleaned and then treated with a silicate coating.

Silicate coatings have been found to be particularly useful for metal substrates such as aluminum sheeting. Examples of such treatments are described in U.S. Pat. No. 2,714,066 (Jewett et at.). Treating the metal substrate with a silicate typically renders the metal surface hydrophilic and provides a scum-preventing film or surface. The silicate coating also enhances adhesion between the metal substrate and the photosensitive material (or any intermediate layers of material) and provides a barrier such that the metal substrate and the overlying material(s) do not react. Thus, the silicate can enhance the shelf life of a nonexposed construction. Suitable silicates are water soluble or water dispersable, and are preferably in the form of a colloidal solution. Examples of suitable silicates include calcium silicate, silicic acid, sodium silicate, and the like, which are commercially available from conventional sources. Preferred silicates are alkali metal silicates such as sodium silicate (1 Na$_2$O:2 SiO$_2$) which is commercially available as E brand sodium silicate from PQ Corp., Valley Forge, Pa.

The substrate can also have coated thereon a primer layer that enhances the adhesion of the photosensitive material and/or the other components in the photosensitive layer to a metal or polymeric surface. Preferred primer materials are those that also enhance image quality. Suitable such materials include, for example, diazo compounds, acrylic resins crosslinked with melamine resins, and polyester resins. Preferably, the primer materials are photoactive, and more preferably are reactive with the components of the photosensitive layer upon exposure to radiation. Most preferably, the primer materials are diazo compounds. A particularly preferred diazo compound is the condensation product of p-diazodiphenylamine and p-formaldehyde, prepared as described in U.S. Pat. No. 2,714,066 (Jewett et at.). The diazo compound, which is generally in the form of a resin, is typically dispersed in a water/methanol mixture and coated onto the substrate. A variety of conventional coating techniques, e.g., roll coating, can be used. The primer layer can also include colorants and stabilizers. Examples of suitable stabilizers are citric acid, boric acid, thiourea, and blends thereof.

The photosensitive layer, i.e., layer of photosensitive composition, can be either a positive- or a negative-acting imaging system. In the practice of the invention, the protective overcoating is particularly useful for negative-acting imaging systems in which radicals are generated in a photopolymerization process. The photosensitive composition for a negative-acting photosensitive imaging system comprises at least one kind of photopolymerizable material and at least one kind of photoinitiator. Preferably, the photosensitive composition also includes colorants and binders. Other optional components can be included, such as surfactants, wetting agents, coating rheology modifiers, optical brighteners, plasticizers, fillers, and the like. The photosensitive layer is typically formed by dispersing the materials in a suitable solvent and coating the dispersion onto a substrate, preferably an appropriately treated substrate. The coated substrate is then dried to remove a substantial amount of the solvent, although residual solvent can be present in the coating. Suitable solvents include ketones, alkyl ethers or acetates of propylene glycol, dioxalane, butyrolactone, alcohols, and mixtures thereof.

The photosensitive layer can be formulated such that it can be developed in an aqueous solution that is acidic, neutral, or alkaline. Preferably, the photosensitive layer can be developed in an alkaline developing solution because of the availability of materials to produce such systems. A photosensitive layer that can be developed in an alkaline solution typically contains a photopolymerizable material that can be acidic or nonacidic. If it is nonacidic, the photosensitive layer preferably includes an acidic material, such as an acidic binder. The strength of the developer required to develop the image is generally directly proportional to the molecular weight and the acid content of the acidic material. Generally, photopolymerizable materials with lower molecular weights and high acid content are easier to develop and therefore do not need very aggressive developers. However, too much acid content or too high a molecular weight can cause destabilization of pigment dispersions (discussed below) when acidic binders are used to disperse the pigments.

Useful photopolymerizable materials are polymerizable compounds having at least one ethylenically unsaturated moiety. The compounds can include polymers, monomers, oligomers, prepolymers, or mixtures thereof. Preferably, the photopolymerizable material comprises a multifunctional acrylate oligomer that forms a high molecular weight polymer when exposed to radiation (e.g., ultraviolet radiation or visible light) in the presence of a photoinitiator. Some examples of oligomers nonexclusively include multi(meth)acrylated urethane and/or epoxy oligomers. Preferably, the photopolymerizable material is a multi(meth)acrylated urethane oligomer as described in U.S. Pat. No. 4,304,923 (Rousseau).

The photosensitive composition preferably includes additional polymeric materials to reduce the tackiness of the photopolymerizable material and increase the hardness of the photopolymerizable layer while still maintaining developability in an alkaline solution. Suitable such materials include acidic acrylic and methacrylic polymers and copolymers, polyvinyl acetals, polyvinyl acetate/crotonic acid copolymers, styrene maleic anhydride half ester resins, polyvinyl acetals modified with anhydrides or amines, and mixtures thereof. In a preferred embodiment, the photosensitive layer includes, in addition to the photopolymerizable material, a carboxylated styrene acrylic resin and an acidified polyvinyl acetal resin.

Polyvinyl acetal resins can be modified by methods known in the art, such as methods disclosed in U.S. Pat. Nos. 4,774,161, 4,777,112, 4,741,985, 4,588,669, and 2,861,058, and EP 519,591. Typically, the polyvinyl acetal polymer containing free hydroxyl groups is dissolved in an aprotic solvent. The dissolved resin is then reacted with a dicarboxylic acid anhydride, preferably in the presence of a catalyst such as a tertiary amine, specifically, triethylamine. The resulting solution of the acid modified polyvinyl acetal resin can then be diluted for use in the photosensitive color solution with solvents such as a blend of methyl ethyl ketone and propylene glycol monomethylether.

A particularly preferred photopolymerizable system is disclosed in U.S. Pat. No. 5,258,261 (Heller). One or more kinds of photopolymerizable materials are present in the composition in a total amount of about 10–90% by weight, preferably about 40–70% by weight, based on the total dry weight of the photosensitive layer (i.e., solids content of the coating composition).

The photoinitiator(s) are used in the photosensitive layer to initiate the polymerization reaction. In particularly preferred embodiments, the photoinitiator(s) used must not generate a visible color change in the image after exposure. Examples of suitable photoinitiators nonexclusively include triazines, acetophenones, benzophenones, and thioxanthones. The preferred photoinitiators include IRGACURE 907 (2-methyl-1-(4-(methylthio)phenyl)-2-(4-morpholinyl)-1-propane) from CIBA-GEIGY, Greenboro, N.C., IRGACURE 369 from CIBA-GEIGY, QUANTACURE ITX (isopropylthioxanthone) from Biddle-Sawyer, Corp., New York, N.Y., and triazines tethered to alkylarylpolyether alcohols, which are disclosed in U.S. Pat. No. 5,298,361 (Bonham et al.). One or more kinds of photoinitiators are present in the composition in a total amount of typically about 1.0–20% by weight, based on the total dry weight of the photosensitive layer (i.e., solids content of the coating composition). The optimum amount of photoinitiator is dependent upon the type of photopolymerizable material used, molecular weight of the photoinitiator used, and the light filtering effect of the pigment used.

Pigments or dyes can be used as colorants in the photosensitive layer if desired. Of the various types of colorants, pigments are preferred generally because they provide more light stable colored images. The pigments, which can be organic or inorganic, are generally introduced into the photosensitive formulation in the form of a millbase. A millbase typically includes a pigment, a binder resin that can be milled with the pigment and provides a media to keep the pigment in dispersion, dispersing aids such as surfactants, and a solvent or mixture of solvents, such as methyl ethyl ketone, propylene glycol monomethylether, for suspending the dispersion. Many different pigments are commercially available from sources such as Sun Chemical Co., Mobay Chemical Co., etc., and are well known in the art. The pigment type and color are chosen such that the coated colored element is matched to a preset color target or specification set by the industry.

Binder resins are used to keep the pigment in dispersion while they are milled, and to balance developability and tack when used in a photosensitive coating. Suitable binders nonexclusively include polyvinyl acetate/crotonic acid copolymers, styrene maleic anhydride half esters resins, acrylic and methacrylic polymers and copolymers, polyvinyl acetals, polyvinyl acetals modified with anhydrides and amines, and styrene acrylic resins. These can be used in various combinations if desired to impart different characteristics. In a preferred embodiment, the binder resin is a mixture of a polyvinyl acetal resin, which is a superior resin for milling the pigments, and a carboxylated styrene acrylic resin, which imparts acidity to the millbase to enhance the developability of the photosensitive layer.

Typically, the amount of binder resin used is kept to a minimum needed to keep the pigments dispersed. This amount can vary depending on such factors as the type of pigment, surface treatment of the pigment, milling process (which can involve ball milling, high shear grinding mixers, two-roll pigment mills, and the like), and the size of the pigment particles, for example. Useful amounts are about 10–90 wt-% pigment and 10–90 wt-% binder resin, based on the total solids weight of the pigment and binder. Preferably the binder resins are used in an amount of about 15–60 wt-%.

Other components can also be included in the millbase to improve solution stability, processing, and compatibility of the millbase to the formulation to which it is added. Examples of other optional additives include dispersing agents other than the binder resins, surfactants, fluorescent materials, optical brighteners, UV absorbers, fillers, etc.

The amount of pigment present in the photosensitive layer will depend on the desired color. Typically, the amount of millbase added to the photosensitive layer composition, i.e., photosensitive color solution, is up to about 35 wt-% (solids in the millbase resulting from pigment, binder, etc., based on the total solids weight of the photopolymerizable composition).

The protective overcoating useful in the practice of the invention is soluble in the desired developer to allow for development of an image of the photosensitive layer. It includes an oxygen barrier polymeric material and an antiblocking particulate material.

The oxygen barrier polymeric material is needed for photosensitive materials which, when exposed to radiation, generate free radicals that can be quenched by oxygen, thereby inhibiting the polymerization process. The oxygen barrier should be clear, i.e., nonhazy, after it has been formed on the photosensitive layer, and remain clear until the photoimageable element, e.g., photo label is used. The oxygen barrier polymeric material should have an oxygen permeability of no greater than about $10^{-14}$ cc(cm)/cm$^2$(sec)(Pa). A preferred material for an oxygen barrier polymeric material is polyvinyl alcohol, which has a reported oxygen barrier permeability of $10^{-16}$–$10^{-18}$ cc(cm)/cm$^2$(sec)(Pa) (i.e., per unit pressure drop) (*Polymer Handbook*, Third Edition, Ed. J. Brandrup and E. H. Immergut, John Wiley & Sons, Inc., 1989, pages VI/435–441).

Commercially available polyvinyl alcohols, such as those available from Air Products & Chemicals, Inc., Allentown, Pa., under the tradename AIRVOL, are classified by viscosity and percent hydrolyzed. Viscosities (as measured in a 4% solids solution in water at 20° C. on a Brookfield viscometer) can be ultra low (3–4 centipoise or "cps"), which have number average molecular weights of about 7,000–13,000 and weight average molecular weights of about 13,000–23,000; low (5–6 cps), which have number average molecular weights of about 15,000–27,000 and weight average molecular weights of about 31,000–50,000; medium (22–30 cps), which have number average molecular weights of about 44,000–65,000 and weight average molecular weights of about 85,000–146,000; and high (40–65 cps), which have number average molecular weights of about 70,000–101,000 and weight average molecular weights of about 124,000–186,000. Polyvinyl alcohols having low viscosities are preferred for ease of coating, while having a sufficiently high molecular weight to provide adequate moisture resistance.

Polyvinyl alcohols are commercially available with varying degrees of hydrolysis, i.e., from about 80% to 99.3+%. Preferred polyvinyl alcohols have a degree of hydrolysis of about 85–99%. In general, the higher the degree of hydrolysis, the better the oxygen barrier properties. Also, polyvinyl alcohols with a higher degree of hydrolysis have better moisture resistance and are less water sensitive. Higher molecular weight polyvinyl alcohols also have better moisture resistance, but increased viscosity. In the practice of the invention, it is desirable to find a balance of properties in which the polyvinyl alcohol has sufficient moisture resistance, good oxygen barrier properties, can be handled easily in the coating process (knife coating, roll coating, die coating, curtain coating, etc.), and is sufficiently water soluble so as to be easily removed during the developing process. To achieve such a balance, it is useful to blend a polyvinyl alcohol with a higher degree of hydrolysis and higher viscosity, with one having a lower degree of hydrolysis and lower viscosity. For example, one could blend a polyvinyl alcohol having a degree of hydrolysis of about 87–89% hydrolysis and a viscosity of about 5.2–6.2 (AIRVOL 205 from Air Products) and a polyvinyl alcohol having a degree of hydrolysis of about 98.0–98.8% and a viscosity of about 5.5–6.6 (AIRVOL 107 from Air Products). It should be understood, however, that the choice of polyvinyl alcohol can also be controlled by the coating method used. For example, when die coating, it is desirable to maintain the coating viscosity of the protective layer composition between about 5 and 15 cps, and preferably between about 6 and 12 cps.

The oxygen barrier polymeric material is preferably used in an amount of about 10–95 wt-%, more preferably about 25–90 wt-%, and most preferably about 40–80 wt-%, based on the total weight of solids in the protective overcoating.

The protective overcoating further includes additives to prevent blocking. Useful additives include water insoluble organic or inorganic particulate material, i.e., particles or beads, that do not fuse during drying of the protective overcoating and are compatible with the components of the coating composition. As used in this context, "compatible" means that the particles do not agglomerate in the dried film.

A preferred antiblocking additive consists of organic polymeric beads that have a narrow size distribution, preferably with the mean of that distribution between 1.5 and 15 times the thickness of the protective layer. Typically, the protective layer can range from about 0.5 μm to about 5 μm thick. Thus, the particles vary from mean sizes of about 0.75 μm to about 75 μm, depending on the specific applied coating thickness. Preferably, the particles vary from mean sizes of about $4 \times 10^{-4}$ cm to about $8 \times 10^{-4}$ cm. The concentration of the particulate material can vary from about 0.1 wt-% to about 1.0 wt-%, preferably about 0.1–0.6 wt-% (based on the total weight of the solids in the protective overcoating) depending on the coating thickness of the protective overcoating, the particle diameter, and the size distribution (the wider the size distribution, the more polymer beads required for a specific antiblocking requirement).

The particulate material preferred in the practice of the present invention should possess the following characteristics: (1) as a preference only (not a requirement), the particles may have a Tg of at least about 45° C., and more preferably at least about 60° C.; (2) a preferably narrow particle size distribution (e.g., fewer than 35%, preferably fewer than 25%, and more preferably fewer than 20%, of the particles by number varying by more than 50% from the mean average diameter) and more preferably a monodisperse particle addition is used; (3) an index of refraction close (i.e., within 0.10) to that of the components of the protective stratum (again, this is a preference and not a requirement); (4) beads without sharp features (e.g., smooth surfaces) are preferred, with spherical, oblong, ovoid, or of elliptical cross-section being most preferred; (5) the particles should be relatively free of surface impurities that resist wetting by a solvent (usually surface impurities should constitute less than 10% of the surface area and preferably less than 3% of the surface area of the particles); (6) the specific gravity of the particles is preferred to be within 25% of that of the coating solution to assist in preventing separation during coating; and (7) the particles should be nontacky to enable them to both be easily dispersed and resist agglomeration in the coating solutions.

Examples of suitable antiblocking particulate material, i.e., particles or beads, nonexclusively include: polymethylmethacrylate (PMMA beads); polyethylene beads; substituted PMMA beads (e.g., substituted with carboxyl groups) such as those available under the tradenames RHOPLEX B-88 latex, ACRYLOID ASE-95NP (alkali soluble or swellable beads), and ACRYSOL ASE-60 all from Rohm & Haas, Charlotte, N.C.; carboxylated polystyrene beads; azlactone beads; urea-formaldehyde particles, such as PERGOPAK M2 particles available from CIBA-GEIGY; styrene/acrylic beads, such as the hollow sphere "pigment" beads available under the tradename RHOPAQUE HP-91 from Rohm & Haas; and beads comprising diol di(meth)acrylate homopolymers or copolymers of these diol di(meth)acrylates with long chain fatty alcohol esters of (meth)acrylic acid and/or ethylenically unsaturated comonomers, such as SMA-HDDA (stearyl methacrylate/hexanediol diacrylate) crosslinked beads, as described in U.S. Pat. No. 5,238,736 (Tseng et at.). Also useful antiblocking particulate material includes inorganic particles including silica particles such as SIPERNAT particles available from DeGussa Corp., Arlington Heights, Ill., SYLOID particles available from Grace GmbH, Ridgefield Park, N.J., GASIL 23F particles available from Crosfield Chemicals, Baltimore, Md., and the like.

The preparation of polymethylmethacrylate beads is generally known, and can be made by a number of methods, including dispersion polymerization, which is described in S. Shen, et al., *J. Polymer Sci., Part A: Polymer Chem.*, 32, 1087–1100 (1994), John Wilery & Sons, Inc. The bead solution typically includes a dispersing agent to keep the beads in suspension and prevent them from agglomerating in the solution. Polymeric dispersing agents are useful in the practice of the present invention, and include poly(vinylpyrrolidone) available from GAF Corp., and anionic polymeric dispersing agents sold under the tradename DAXAD by W. R. Grace, New York, N.Y.

Briefly, the process for making PMMA beads involves washing methylmethacrylate monomer with 10% aqueous sodium hydroxide and passing through an activated aluminum oxide column to remove any inhibitor. A typical formulation for polymerization, in weight percent, is 2.0–10.0% methylmethacrylate, 93.0–85.9% methanol, 4% dispersing agent, and 0.1% polymerization initiator. Useful initiators include free radical initiators such as 2,2'-azobis(isobutyronitrile) available from DuPont under the trade name VAZO 64. Specifically, in the process, the dispersing agent, initiator, methanol, and methylmethacrylate monomer are added to a bottle, cooled in ice, and mixed. The solution is passed through a 0.2 micrometer pore size filter to remove any colloidal species, and placed into a reaction container that had been cooled with ice. The reaction container is purged with nitrogen, sealed, and heated to about 55° C. until the reaction is finished. For a 5 milliliter sample, the reaction time is about 20 minutes. The particles are then filtered, washed with water, and dried at ambient temperature to produce a free flowing powder that can be redispersed in water with a dispersing agent.

Other optional components in the protective overcoating include adjuvants to enhance coating or shelf stability such as defoamers, surfactants and biocides. Surfactants improve the wetting of the protective mating onto the photosensitive layer to form a smooth coating. Suitable examples of surfactants include those commercially available from Rohm & Haas under the TRITON tradename, and from Air Products under the SURFYNOL tradename, or organic solvents such as isopropanol. Biocides may be added to the composition to improve shelf life of the compositions, and are commercially available, such as those sold under the tradename KATHON by Rohm & Haas.

The total thickness of the protective overcoating can range from about 0.5 μm to about 5 μm, depending on the substrate on which it is coated. The protective overcoating is preferably dried at a temperature high enough to drive off most of the water. For a 0.5 μm coating, three minutes at about 80° C. is generally sufficient. For thicker coatings, longer dwell times in the oven may be needed.

A layer of an adhesive can also be used in certain preferred embodiments of the present invention. It is applied to the substrate on the side opposite to that of the photosensitive layer and can be protected by a release liner. The adhesive can be a pressure sensitive adhesive or a heat activated adhesive. Pressure sensitive adhesives are known in the art and can be coated from water, as in emulsion adhesives, or they can be hot melt coated, or solvent coated. Adhesives are typically selected to adhere to the desired surfaces. For example, acrylate pressure sensitive adhesives are particularly useful for adhering to aluminum and polyester substrates because of the ability to adhere to polar substrates, and are relatively inexpensive. The preparation of acrylate adhesives can be made by a number of different processes such as the process disclosed in U.S. Pat. No. Re 24,906 (Ulrich). Other useful types of adhesives include natural rubber adhesives, block copolymer adhesives, and silicone adhesives. Pressure sensitive adhesives are commercially available as emulsion or solvent based adhesives which can be coated directly onto the substrate, dried and/or cured, and laminated to a release liner (e.g., paper or a polypropylene, polyethylene, or polyester film coated with a release material such as silicone) to protect the adhesive. The adhesive can also be coated onto a release liner, dried and/or cured, and then laminated onto the substrate. The adhesive can also be supplied as an adhesive transfer tape such as SCOTCH brand laminating adhesive 9475 or 9466, which are available from Minnesota Mining & Manufacturing Company, St. Paul, Minn.

The metal-based photoimageable elements of the present invention can be used as printing plates, photolabels, e.g., metal labels, signs, plaques, and a variety of other applications.

Objects and advantages of this invention are further illustrated by the following examples. The particular materials and amounts thereof recited in these examples as well as other conditions and details, should not be construed to unduly limit this invention. All materials are commercially available except where stated or otherwise made apparent.

EXAMPLES

Test Procedures

Surface Quality

This test measures the ability of the protective overcoating to resist scuffing, surface impressions, etc., when aged at room temperature (20°–25° C.) under a weight. A substrate sheet material having coated thereon an optional primer layer, the photosensitive layer, and the protective overcoating was cut into 10 samples measuring 12 inches×18 inches (20 cm×46 cm) and wrapped in a black, 3-mil ($7.6 \times 10^{-3}$ cm), photographic grade, polyethylene bag (available from either Banner Packaging, Inc., Oshkosh, Wis., or American Western Corp., Fairmont, Minn.). A 5 pound weight (2.7 kg) was placed on top of this package, and the samples were aged for 7 days at room temperature (20°–25° C.). Each sample was then inspected for visual appearance, rated on a scale of 0 to 6, and the physical condition of each sample was recorded. Sheet 1 refers to the top sample in the stack, and sheet 10 refers to the bottom sample in the stack. The rating scale is as follows:

0=unblemished surface with no visible imperfections
1-2=slight flaws, but would not affect image quality
3=numerous flaws, but would not affect image quality
4=numerous flaws that could affect image quality
5-6=numerous flaws that would affect image quality In the aging test, the fewer the number of sheets exhibiting flaws, the better the protective overcoating. It is preferable to have as many sheets as possible, out of the ten sheets in the stack, with a rating of 0.

Preparation of Materials

Preparation of Acrylated Urethane Oligomer

A polyol was prepared by mixing ε-caprolactone (54.3 g, 0.48 equivalent), dipentaerythritol (15.3 g, 0.36 equivalent), and zinc borate catalyst (0.02 g) in a 100-mL flask. The mixture was heated to 170° C. for 4 hours under a nitrogen atmosphere. The mixture was cooled under a nitrogen atmosphere to room temperature to yield a polyol having an hydroxy equivalent weight of 200.

To a 1-liter flask was added 2,4-tolylene diisocyanate (86.2 g, 0.99 equivalent), BHT (butylated hydroxy toluene) inhibitor (0.61 g), methyl ethyl ketone (112 g), dibutyltin dilaurate (0.12 g), and methacrylic acid (3.5 g). A 90/10 nitrogen/oxygen mixture was bubbled through the mixture during the reaction. The mixture was stirred and (70.9 g, 0.54 equivalent) hydroxyethyl methacrylate was slowly added. When all of the hydroxyethyl methacrylate was reacted, polyol (175.2 g, 0.91 equivalent), methyl ethyl ketone (110 g), and dibutyltin dilaurate (0.28 g) were added. The flask was held at a reaction temperature of 60° C. for 8 hours or until no isocyanate was present as determined by infrared spectroscopy. Following this, succinic anhydride (27.0 g, 0.27 equivalent), lithium acetate (0.7 g), and methyl ethyl ketone (18 g) were added to the flask. The resultant reaction mixture was held at 70° C. for 16 hours. The final product was a carboxy-substituted urethane oligomer.

Preparation of Triazine Photoinitiator

This preparation illustrates a simple, two-step, one-batch reaction of 2,4-bis(trichloromethyl)-6-[3-(2-hydroxyethoxy)styryl]-1,3,5-triazine (meta-MOSTOL), 2,4-tolylene diisocyanate (TDI), and polyoxyethylene nonylphenol (IGEPAL CO-520) to prepare a mixture containing 80% meta-MOSTOL/TDI/POENP5, 15% [meta-MOSTOL]$_2$/TDI, and 5% [POENP5]$_2$/TDI, which mixture can function as a photoinitiator. POENP5 is a polyoxyethylene nonylphenol having a mole ratio of 5 polyoxyethylene units to nonylphenyl units (commercially available from GAF Corp., New York, N.Y. under the tradename IGEPAL CO-520).

A stirred solution of 2,4-bis(trichloromethyl)-6-methyl-1,3,5-triazine (103 g, 0.31 mole), 3-(2-hydroxyethoxy)benzaldehyde (47 g, 0.28 mole), and ammonium acetate (10.5 g) in 270 mL of methanol was refluxed for 12 hours. After the mixture had cooled, an additional 80 mL of methanol was added, followed by 112 mL of water. The product precipitated from the reaction solution, was filtered, and dried to yield 74 g of meta-MOSTOL, mp 127°–128° C.

To a stirred dispersion containing meta-MOSTOL (55.00 g, 0.1151 mole) and 2,4-tolylene diisocyanate (18.2 g, 0.102 mole) in 200 mL of toluene at a temperature of 16° C. was added dibutyltin dilaurate (0.150 g). A slight exotherm raised the temperature of the reaction mixture to 19° C. and the reaction mixture became clear after approximately 20 minutes. The meta-MOSTOL had completely reacted in 5 hours. The resulting mixture was analyzed by GPC and found to contain the following materials: meta-MOSTOL/TDI (54.5 g, 0.0837 mole), (meta-MOSTOL)$_2$/TDI (17.7 g, 0.0314 mole), and 2,4-tolylene diisocyanate (0.9 g, 0.0052 mole).

To this mixture was added a 79.2% solution of polyoxyethylene nonylphenol (IGEPAL CO-520) (58.92 g, 0.0941 mole) in toluene. The solution was heated to a temperature of 60° C. and maintained at that temperature for four hours. Infrared analysis indicated that all of the isocyanate had reacted. The reaction mixture was determined by high performance liquid chromatography (HPLC) analysis to contain approximately 80% (96.0 g) meta-MOSTOL/TDI/POENP5, 15% (78.8 g) [meta-MOSTOL]$_2$/TDI, and 5% (6.0 g) [POENP5]$_2$/TDI. Removal of the toluene under vacuum by means of a rotary evaporator provided a slightly brown viscous syrup. For ease of handling, this material was redissolved in sufficient methyl ethyl ketone to produce a solution having a concentration of approximately 50%.

Preparation of Diazo Resin

The following reactions were carried out under subdued light, e.g., a yellow light. The sulfate salt of p-diazodiphenyl amine (34 parts) was mixed with p-formaldehyde (3.25 parts) and anhydrous zinc chloride (4.5 parts). This mixture was gradually introduced into cool sulfuric acid (135 parts, 66° Baume), care being taken that the temperature did not exceed 6° C. When poured on twice its weight of ice, the brown solution decomposed to a black tarry material, which was then collected and dissolved in water. Addition of an excess of a saturated zinc chloride solution to this aqueous diazo resin resulted in a yellow precipitate, which was then collected, dissolved in water, and reprecipitated using alcohol. This new precipitate was the purified light-sensitive diazo resin. A priming solution was prepared by mixing 95.44 parts distilled water, 0.28 part citric acid, 0.28 part boric acid, 0.83 parts thiourea, 3.10 parts diazo resin, and 0.07 part surfactant (TRITON X-100 available from Rohm & Haas).

Developer Solution

A developer solution was prepared by mixing, by weight percent, 1% sodium carbonate, 1% potassium bicarbonate, 0.1% surfactant (SURFONYL 465 available from Air Products & Chemicals, Inc., Allentown, Pa.), and 97.9% water.

Preparation of Millbase Compositions

Millbase compositions were prepared by dispersing and milling the pigments, the solvents, and the resins with the surfactant and dispersing aid. A specific composition is shown in Table 1.

TABLE 1

Millbase Composition

| | Black | |
|---|---|---|
| Component | % by Wt. of Total Soln | % by Wt. of Solids |
| Black pigment (Raven 760 Black pigment from Columbia Chemical Co., New York, NY) | 11.07 | 57.1 |
| Polyvinyl Butyral (BUTVAR B-98 polyvinyl acetal from Monsanto, St. Louis, MO) | 1.98 | 10.2 |
| Carboxylated styrene acrylic resin (JONCRYL 67 from S.C. Johnson Wax, Racine, WI) | 5.32 | 27.4 |
| Dispersing agent (DISPERSBYK 161 from Byk Chemie, USA, Wallingford, CT) | 0.99 | 5.1 |
| Surfactant (FC-430 from Minnesota Mining & Manufacturing Co., St. Paul, MN) | 0.04 | 0.2 |
| Methyl ethyl ketone | 48 | — |
| Propylene glycol monomethylether | 32 | — |
| Percent Solids | 20 | 100 |

Photosensitive Color Solutions

Photosensitive color solutions, i.e., photosensitive compositions, were prepared by mixing the millbase compositions with the binders, photopolymers, solvents, etc., in the amounts shown below in Table 2. Normal precautions, such as processing under yellow lights, were taken throughout the handling of the photosensitive materials to prevent premature exposure.

| PHOTOSENSITIVE COLOR SOLUTION - PARTS BY WEIGHT | BLACK |
|---|---|
| Black Millbase | 22.4 |
| Acidified BUTVAR ACB-98 - 15% solids in 35% methyl ethyl ketone and 50% propylene glycol monomethylether (BUTVAR B-98 polyvinyl acetal modified with succinic anhydride and triethyl amine as disclosed in EP 519,591 A1) | 9.7 |
| Acrylated urethane oligomer (prepared as described above) - 40% solids in methyl ethyl ketone | 27.1 |
| Carboxylated styrene acrylic resin premix prepared by dissolving 35 parts styrene acrylic resin (JONCRYL 67 available from S.C. Johnson Wax) in 65 parts methyl ethyl ketone | 1.1 |
| Triazine photoinitiator (prepared as described above) - 50% solids in methyl ethyl ketone | 5.4 |
| Methyl ethyl ketone | 21.6 |
| Propylene glycol monomethylether | 12.7 |
| % Solids of Solution | 19.9 |

EXAMPLE 1

An aluminum substrate was prepared by dipping a 0.005 inch (0.127 mm) thick aluminum substrate (American Aluminum Association H26 3003 available from Alcoa, Davenport, Iowa) into a 3% solids colloidal solution of sodium silicate (E brand sodium silicate available from PQ Corporation, valley Forge, Pa.), and drying. Prior to this, the aluminum had been cleaned by dipping it in a hot (190° F.) water solution containing about 5% trisodium phosphate, rinsed with water, and immediately desmutted with nitric acid (about 35% solution). After the sodium silicate had been applied, one side was further roll coated with the diazo resin solution described above. The black photosensitive color solution containing the acrylated urethane oligomer was then roll coated to a coating weight of 275 mg/ft$^2$ (dry coating weight, 3.0 g/m$^2$) onto the diazo resin coating and dried at about 130° F. (54° C.).

A solution for the protective overcoating was prepared by mixing 95.923 parts deionized water, 4 parts polyvinyl alcohol (AIRVOL 205 from Air Products), 0.04 part surfactant (TRITON DF-16 from Rohm& Haas, Philadelphia, Pa.), and 0,037 part of a 20% solids bead solution. The PMMA beads used have an average diameter of 6 μm, with about 90% of the beads between 5.5 μm and 6.5 μm, and 0% greater than about 12 μm. The composition was coated to a coating weight of 1.4 g/m$^2$ and dried at 82° C. The coated substrate was then tested for surface quality according to the Surface Quality Test procedure defined above. The results are shown in Table 3.

COMPARATIVE EXAMPLE C1

A substrate was prepared as in Example 1 except that the protective overcoating composition was prepared by mixing 95.96 parts deionized water, 4 parts polyvinyl alcohol (AIRVOL 205), and 0.04 parts surfactant (TRITON DF-16). The composition was coated to a coating weight of 0.75 g/m$^2$ and dried at 49° C.

TABLE 3

| | Visual Rating After Aging With 5 Pound Weight | |
|---|---|---|
| Sheet | Example 1 | Example C1 |
| 1 | 2 | 1.5 |
| 2 | 2 | 1.5 |
| 3 | 2 | 1.5 |
| 4 | 2 | 1.5 |
| 5 | 1.5 | 1.5 |
| 6 | 1.5 | 1.5 |
| 7 | 1 | 1 |
| 8 | 1 | 1 |
| 9 | 1 | 1 |
| 10 | 1 | 0 |

The data in Table 3 show that the protective overcoatings of the invention are useful in reducing surface impressions when sheets are aged. All of the examples of the present invention produced acceptably good image quality as compared to commercially viable metal label products. Also, upon visual inspection the composition represented by Example 1 exhibited less blocking and picking, in which portions of the coating stick to the backside of the substrate in roll form or are "picked off" of the coated side and adhere to the backside of the substrate, leaving voids in the coating, than did the composition represented by Comparative Example C1.

While this invention has been described in connection with specific embodiments, it should be understood that it is capable of further modification. The claims herein are intended to cover those variations which one skilled in the art would recognize as the chemical equivalent of what has been described herein. Thus, various modifications to the principles described herein may be made by one skilled in the art without departing from the true scope and spirit of the invention which is indicated by the following claims.

What is claimed is:

1. A photoimageable element comprising:
   (a) a metallic substrate coated with a primer layer;
   (b) a layer of a photosensitive composition comprising a photosensitive material coated on the primer layer on the metallic substrate; and
   (c) a protective overcoating comprising an oxygen barrier polymeric material and antiblocking particulate material; wherein the oxygen barrier polymeric material has an oxygen permeability of no greater than about $10^{-14}$ cc(cm)/cm$^2$(sec)(Pa).

2. The photoimageable element of claim 1 wherein the oxygen barrier polymeric material comprises polyvinyl alcohol.

3. The photoimageable element of claim 1 wherein the antiblocking particulate material comprises polymethylmethacrylate beads.

4. The photoimageable element of claim 1 wherein the antiblocking particulate material has a mean particle size of about 0.75 μm to about 75 μm.

5. The photoimageable element of claim 4 wherein the antiblocking particulate material has a mean particle size of about $4 \times 10^{-4}$ cm to about $8 \times 10^{-4}$ cm.

6. The photoimageable element of claim 1 wherein the antiblocking particulate material has a Tg of at least about 45° C.

7. The photoimageable element of claim 1 wherein the antiblocking particulate material is present in the protective overcoating in an amount of about 0.1 wt-% to about 1.0 wt-%, based on the total weight of the solids.

8. The photoimageable element of claim 1 wherein the metallic substrate is an aluminum substrate.

9. A photoimageable element comprising:
   (a) a metallic substrate coated with a primer layer on a first side;
   (b) a layer of a photosensitive composition comprising a photosensitive material coated on the primer layer on the first side of the metallic substrate;
   (c) a protective overcoating comprising an oxygen barrier polymeric material and antiblocking particulate material; wherein the oxygen barrier polymeric material comprises a blend of at least two polyvinyl alcohols having different levels of viscosity and hydrolysis;
   (d) a layer of a pressure sensitive adhesive coated on a second side of the substrate; and
   (e) a release liner covering the pressure sensitive adhesive.

10. The photoimageable element of claim 9 wherein the metallic substrate is an aluminum substrate.

11. The photoimageable element of claim 9 wherein the antiblocking particulate material comprises polymethylmethacrylate beads.

12. The photoimageable element of claim 9 wherein the antiblocking particulate material has a mean particle size of about 0.75 μm to about 75 μm.

13. The photoimageable element of claim 12 wherein the antiblocking particulate material has a mean particle size of about $4 \times 10^{-4}$ cm to about $8 \times 10^{-4}$ cm.

14. The photoimageable element of claim 9 wherein the antiblocking particulate material has a Tg of at least about 45° C.

15. The photoimageable element of claim 9 wherein the antiblocking particulate material is present in the protective overcoating in an amount of about 0.1 wt-% to about 1.0 wt-%, based on the total weight of the solids.

16. A photolabel comprising:
   (a) an aluminum substrate coated on a first side with a primer layer comprising a diazo compound;
   (b) a layer of a photosensitive composition comprising a photosensitive material coated on the primer layer on the first side of the metallic substrate; and
   (c) a protective overcoating comprising an oxygen barrier polymeric material and antiblocking particulate material; wherein the oxygen barrier polymeric material comprises a blend of at least two polyvinyl alcohols having different levels of viscosity and hydrolysis.

17. The photolabel of claim 16 wherein the antiblocking particulate material comprises polymethylmethacrylate beads.

18. The photolabel of claim 16 wherein the antiblocking particulate material has a mean particle size of about $4 \times 10^{-4}$ cm to about $8 \times 10^{-4}$ cm.

19. The photolabel of claim 16 wherein the antiblocking particulate material has a Tg of at least about 45° C.

20. The photolabel of claim 16 wherein the antiblocking particulate material is present in the protective overcoating in an amount of about 0.1 wt-% to about 1.0 wt-%, based on the total weight of the solids.

* * * * *